(12) United States Patent
Kita

(10) Patent No.: US 6,218,257 B1
(45) Date of Patent: Apr. 17, 2001

(54) METHOD OF FORMING SEMICONDUCTOR MEMORY DEVICE

(75) Inventor: Akio Kita, Tokyo (JP)

(73) Assignee: Oki Electric Industry Co., LTD, Tokyo (JP)

( * ) Notice: Subject to any disclaimer, the term of this patent is extended or adjusted under 35 U.S.C. 154(b) by 0 days.

(21) Appl. No.: 09/007,835

(22) Filed: Jan. 15, 1998

(30) Foreign Application Priority Data

Feb. 25, 1997 (JP) .................................................. 9-039616

(51) Int. Cl.$^7$ .................................................. H01L 21/20
(52) U.S. Cl. .......................... 438/396; 438/255; 438/398
(58) Field of Search ............................ 437/47; 438/398, 438/253, 255, 240, 396, 573; 117/89

(56) References Cited

U.S. PATENT DOCUMENTS 5,366,917 * 11/1994 Watanabe et al. .................... 438/47
5,759,895 * 6/1998 Tseng ................................. 438/255
5,814,924 * 9/1998 Komatsu ............................ 313/309
5,872,041 * 2/1999 Lee et al. ........................... 438/397
5,888,295 * 3/1999 Sandhu et al. ...................... 117/89
5,976,931 * 11/1999 Yew et al. .......................... 438/255

FOREIGN PATENT DOCUMENTS 4-320370  11/1992 (JP) .
4-368172  12/1992 (JP) .

* cited by examiner

Primary Examiner—Matthew Smith
Assistant Examiner—Calvin Lee
(74) Attorney, Agent, or Firm—Jones Volentine, L.L.C.

(57) ABSTRACT

Since the capacitor of the semiconductor memory has the storage electrode comprising a shape of the cylindrical structure having rough polysilicon portions on base and sidewall portions thereof, it can increase electrostatic capacitance. Further, since the rough portions of the base and sidewall rough storage electrode layers are respectively formed by independently controlling a condition of Chemical Vapor Deposition, it can easily control formations of the rugged portions of the capacitor, therefore it can achieve the improvement of the productivity of the rough portions. Accordingly, the semiconductor can achieve a stability of a memory operation.

26 Claims, 10 Drawing Sheets

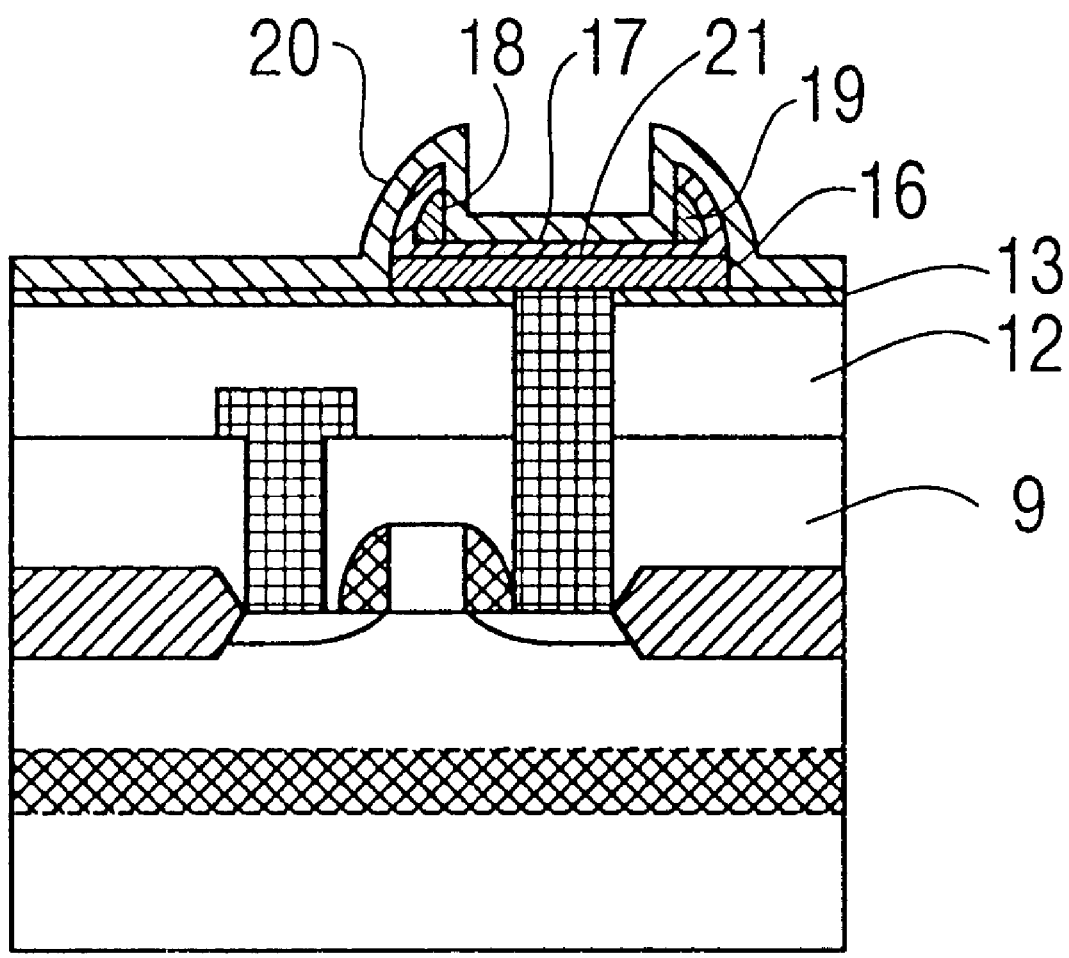

METHOD OF FORMING SEMICONDUCTOR MEMORY DEVICE

BACKGROUND OF THE INVENTION

1. Field of the Invention

The present invention generally relates to a method of forming a semiconductor memory device, and more particularly, the present invention relates to a method of forming a capacitor.

This application is a counterpart of Japanese application Serial Number 039616/1997, filed Feb. 25, 1997, the subject matter of which is incorporated herein by reference.

2. Description of the Related Art

FIG. 4 is a cross sectional view showing a one-bit memory cell of a conventional DRAM (Dynamic Random Access Memory), the one bit memory cell having a switching transistor, a capacitor, a bit line and a word line. The switching transistor includes a gate oxide layer 105, a gate electrode 106 and a pair of n-type impurity regions 107. The capacitor includes a storage electrode 116, 117, a dielectric layer (not shown) and a plate electrode 118, the storage electrode 116, 117 having the cylindrical structure. The bit line 111 connects to one of the n-type impurity regions 107 through a bit contact 110. The word line also serves as the gate electrode 106. The capacitor connects with the switching transistor through a storage contact 114 and a polysilicon plug 115.

As shown in FIG. 4, the memory cell includes a p-type silicon substrate 101, an n-type guard layer 102 surrounding the memory cell, a p-type well 103 surrounded by the n-type guard layer 102, a field oxide layer 104 to separate memory cells, insulator layers 109, 112, 119, a silicon nitride layer 113 serving as a channel stopper, and a passivation layer 121.

SUMMARY OF THE INVENTION

An object of the present invention is to provide a method of forming a semiconductor memory device that can precisely control a formation of rough portions of a capacitor.

According to one aspect of the present invention, for achieving the above object, there is provided a method of forming a semiconductor memory device comprising the steps of: forming a first lower electrode layer having a first rough surface over a semiconductor substrate; forming a second lower electrode layer having a second rough surface over the semiconductor substrate, the second lower electrode layer extending from an end of the first lower electrode layer; forming a dielectric layer over the first and second lower electrode layers; and forming an upper electrode layer over the dielectric layer.

According to another aspect of the present invention, for achieving the above object, there is provided a method of forming a semiconductor memory device comprising the steps of: forming a first lower electrode layer having a first rough surface over a semiconductor substrate; forming a mask layer over the first lower electrode layer, the mask layer having a different etching rate from the first lower electrode layer; patterning the mask layer; forming a second lower electrode layer having a second rough surface over the first lower electrode layer and the mask layer; selectively removing the patterned mask layer and a portion of the second lower electrode located over the patterned mask layer; forming a dielectric layer over the first and second lower electrode layers; and forming an upper electrode layer over the dielectric layer.

According to another aspect of the present invention, for achieving the above object, there is provided a method of forming a semiconductor memory device comprising the steps of: forming a first lower electrode layer having a first rough surface over a semiconductor substrate; forming a first mask layer over the first lower electrode, the first mask layer having a different etching rate from the first lower electrode layer; forming a second mask layer over the first mask layer, the second mask layer having a smaller etching rate from the first mask layer; patterning the first and second mask layers such that a second sidewall of the second patterned mask layer protrudes from a first sidewall of the first patterned mask layer; forming a second lower electrode layer having a second rough surface over the first lower electrode layer and the first and second mask layers; selectively removing the first and second patterned mask layers and a portion of the second lower electrode located over the first and second patterned mask layers; forming a dielectric layer over the first and second lower electrode layers; and forming an upper electrode layer over the dielectric layer.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in connection with the accompanying drawings, in which:

FIGS. 1A–1G are cross-sectional views showing the steps of forming a semiconductor memory device according to a first preferred embodiment of the present invention.

DETAILED DESCRIPTION OF THE PREFERRED EMBODIMENTS

A first preferred method of forming a semiconductor memory device according to the present invention will hereinafter be described in detail with reference to the accompanying drawings.

FIGS. 1A–1G are cross-sectional views showing the steps of forming a semiconductor memory device according to a first preferred embodiment of the present invention.

Figure 1A:
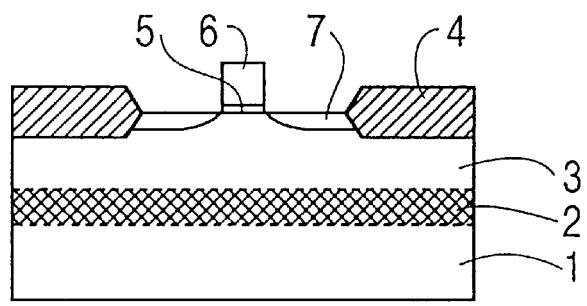

As shown in FIG. 1A, a p-type substrate 1 is provided. The p-type substrate 1 preferably has a resistivity of about 10 Ω. A field oxide layer 4 is then formed in the p-type substrate 1 using LOCOS (Local Oxidation of Silicon). Then, a buried n-type guard layer 2 is formed by implanting phosphorus (P) into the p-type substrate 1, under an implantation having a condition of 800 keV, $1\times10^{13}$ cm$^{-2}$. Then, a p-type well 3 is formed by implanting boron (B) into the p-type substrate 1, under an implantation having a condition of 500 keV, 100 keV, and 30 keV, each $5\times10^{13}$ cm$^{-2}$. Then, a gate oxide film 5, a thickness of about 6 nm is formed on the p-type substrate 1 using a thermal oxidation. A gate electrode 6 is then formed on the gate oxide film 5. Then, a pair of n-type impurity regions 7 having a low density are formed by implanting n-type impurities in the p-type substrate 1 with the gate electrode 6 and the field oxide layer 4 as a mask.

Figure 1B:
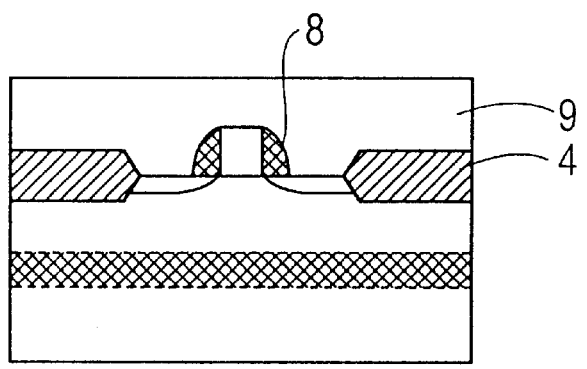

As shown in FIG. 1B, a sidewall 8 is formed on an edge portion of the gate electrode 6. Then, a BPSG film serving as an interlayer insulator layer 9 is formed on the entire structure, preferably to a thickness of about 400 nm, and a re-flow process, 850° C.

Figure 1C:
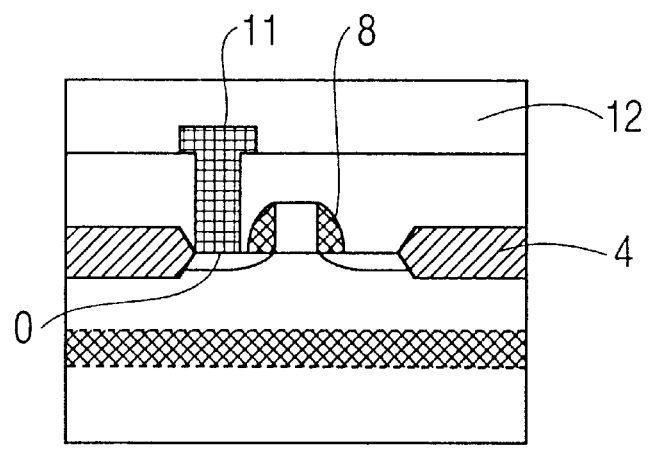

As shown in FIG. 1C, a contact hole 10 is formed going through the interlayer insulator layer 9 and then tungsten-silicide, a thickness 120 nm/doped-polysilicon layer, a thickness 50 nm are buried into the contact hole 10 with an anisotropic etching. Here, the tungsten-silicide serves as a bit line 11. Then, a BPSG film serving as a interlayer insulator layer 12, is formed on the entire structure, preferably to a thickness of about 400 nm, and a re-flow process, is performed at about 850° C.

Figure 1D:
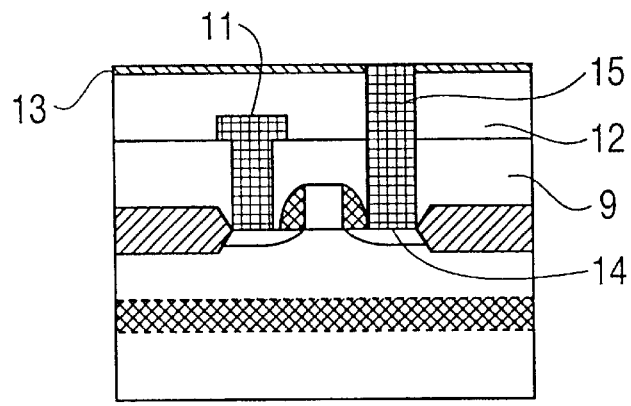

As shown in FIG. 1D, a silicon-nitride layer 13, serving as an etching stopper is formed on the entire surface. Then, a contact hole 14 is made through the interlayer insulator layer 12 and the silicon-nitride layer 13 to one of the n-type impurity regions. Then, a layer of doped polysilicon having a preferred thickness of 400 nm is formed over the silicon nitride layer 13 to form a plug 15, filled into the contact hole 14 and is then removed by an anisotropic etching.

Figure 1E:
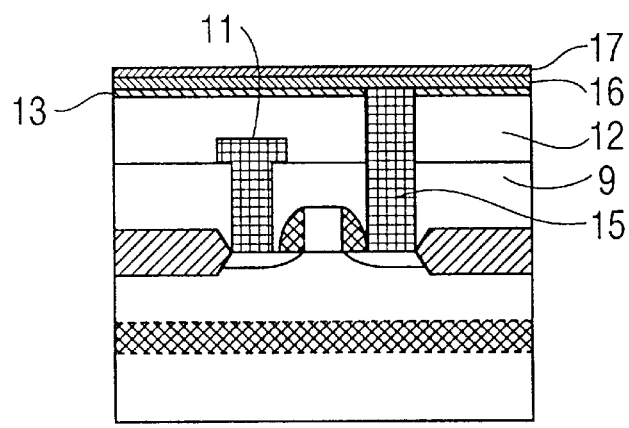

As shown in FIG. 1E, a first smooth polysilicon layer 16, having a thickness of about 50 nm, is formed on the entire surface of the silicon nitride layer 13 using a chemical vapor deposition (CVD) process. Preferably this CVD process uses $SiH_4$ as a source gas, operates at a temperature of 620° C. and a pressure of 0.2 Torr, and uses heavily-doped phosphorus. A first rough polysilicon layer 17, having a thickness of about 150 nm, is then formed on the first smooth polysilicon layer 16. The first rough polysilicon layer 17 has a first rough surface, which has an increased surface area compared to a smooth surface. Phosphorus is implanted into the first rough polysilicon layer 17 at an energy level of 40 KeV and a density of $5 \times 10^{15}$ $cm^{-2}$ in order to cause it to be conductive.

The temperature of the CVD process is a key point in the formation of the first rough polysilicon layer 17. When $SiH_4$ is used as a source gas, the pressure is 0.2 Torr, and the temperature is less than 555° C., amorphous silicon is formed. When $SiH_4$ is used as a source gas, the pressure is 0.2 Torr, and the temperature is more than 580° C., polysilicon is formed. The process of the present invention forms rough polysilicon at a temperature between 555° C. and 580° C. In the present invention, an effective area of the first rough polysilicon layer 17 formed at a temperature of 570° C. is twice as great as that of a conventional polysilicon layer of equal size.

Figure 1F:
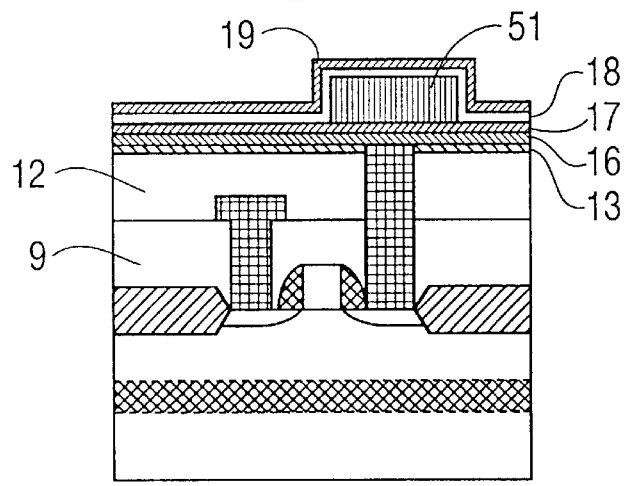

As shown in FIG. 1F, a silicon oxide layer 51 is then formed on the first rough polysilicon layer 17. The silicon oxide layer is then patterned such that an area above the first rough polysilicon layer 17 corresponding to a predetermined position for a storage electrode remains. The patterned silicon oxide layer 51 serves as a spacer. The silicon oxide layer 51 is preferably patterned in a cylindrical shape.

A second smooth polysilicon layer 18, having a thickness of about 30 nm, is then formed over the entire surface of the device using a chemical vapor deposition (CVD) process. Preferably this CVD process uses $SiH_4$ as a source gas, operates at a temperature of 620° C. and a pressure of 0.2 Torr, and uses heavily-doped phosphorus. A second rough polysilicon layer 19, having a thickness of about 150 nm, is then formed on the second smooth polysilicon layer 18. The second rough polysilicon layer 19 has a second rough surface, which has an increased surface area compared to a smooth surface. Phosphorus is preferably implanted into the second rough polysilicon layer 19 at an energy level of 40 KeV and a density of $5 \times 10^{15}$ $cm^{-2}$ in order to cause it to be conductive.

As shown in FIG. 1G, a rough-surfaced sidewall made from the second smooth polysilicon layer 18 and the second rough polysilicon layer 19 is formed along a sidewall of the spacer 51 by heavily anisotropically etching the second smooth polysilicon layer 18 and the second rough polysilicon layer 19. Together the first smooth and rough polysilicon layers 16 and 17 are etched. The spacer 51 is then removed, preferably by dilute hydrofluoric acid. Here, the silicon-nitride layer 13 serves as an etching stopper layer. The second smooth and rough polysilicon layers 18 and 19, form a lower electrode. A dielectric layer 21, made, e.g., of silicon-nitride, is then formed over the resulting structure. The dielectric layer 21 is then annealed in a wet atmosphere to decrease its leakage current and defect density. A third polysilicon layer 20, preferably having at thickness of 100 nm and being heavily implanted with phosphorus, is then formed over the dielectric layer 21. The third polysilicon layer 20 serves as a plate electrode. Together the first smooth and rough polysilicon layers 16 and 17, and the second smooth and rough polysilicon layers 18 and 19, forming a storage electrode, along with the dielectric layer 21 and the third polysilicon layer 20, forming a plate electrode, comprise a storage capacitor.

Since the storage capacitor formed according to the first preferred embodiment is in a cylindrical shape and has rough portions on its base and sidewall, the electrostatic capacitance of the device is increased.

Further, since the rough surfaces on the storage electrode are formed by independently controlling the conditions of various chemical vapor deposition (CVD) processes, the formation of such rough surfaces can be easily controlled. This allows for an improvement in the production of such rough surfaces.

Accordingly, the first preferred embodiment can increase the stability of a memory operation.

FIGS. 2A–2G are cross-sectional views showing the steps of forming a semiconductor memory device according to a second preferred embodiment of the present invention.

Figure 2A:
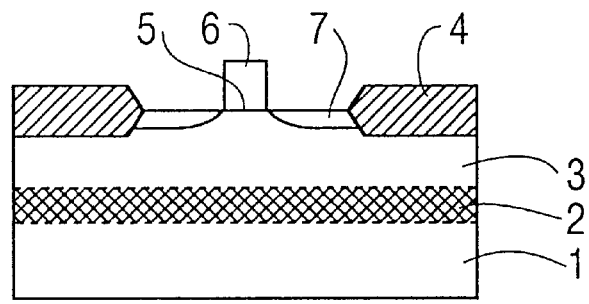
FIGS. 2A–2G are cross-sectional views showing the steps of forming a semiconductor memory device according to a second preferred embodiment of the present invention.

As shown in FIG. 2A, a p-type substrate 1 is provided. The p-type substrate 1 preferably has a resistivity of about 10 Ω. A field oxide layer 4 is then formed in the p-type substrate 1 using LOCOS (Local Oxidation of Silicon). Then, a buried n-type guard layer 2 is formed by implanting phosphorus (P) into the p-type substrate 1, under an implantation having a condition of 800 keV, $1 \times 10^{13}$ $cm^{-2}$. Then, a p-type well 3 is formed by implanting boron (B) into the p-type substrate 1, under an implantation having a condition of 500 keV, 100 keV, and 30 keV, each $5 \times 10^{13}$ $cm^{-2}$. Then, a gate oxide film 5, a thickness of about 6 nm is formed on the p-type substrate 1 using a thermal oxidation. A gate electrode 6 is then formed on the gate oxide film 5. Then, a pair of n-type impurity regions 7 having a low density are formed by implanting n-type impurities in the p-type substrate 1 with the gate electrode 6 and the field oxide layer 4 as a mask.

Figure 2B:
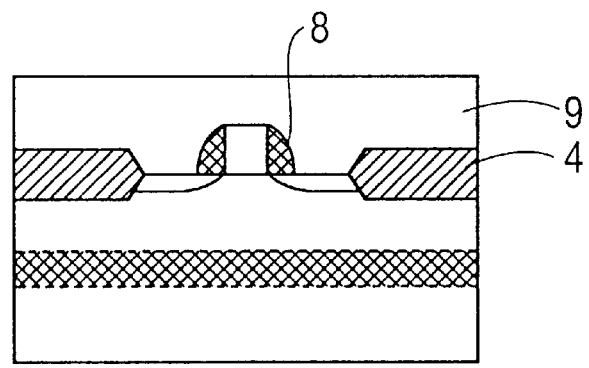

As shown in FIG. 2B, a sidewall 8 is formed on an edge portion of the gate electrode 6. Then, a BPSG film serving as an interlayer insulator layer 9 is formed on the entire structure, preferably to a thickness of about 400 nm, and a re-flow process, 850° C.

Figure 2C:
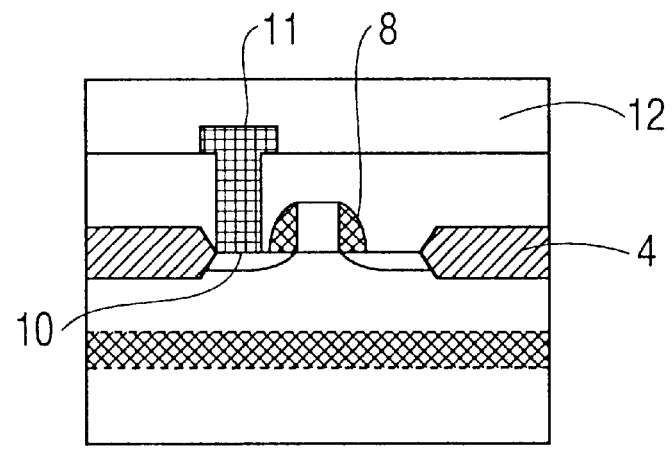

As shown in FIG. 2C, a contact hole 10 is formed going through the interlayer insulator layer 9 and then tungsten-silicide, a thickness 120 nm/doped-polysilicon layer, a thickness 50 nm are buried into the contact hole 10 with an anisotropic etching. Here, the tungsten-silicide serves as a bit line 11. Then, a BPSG film serving as a interlayer insulator layer 12, is formed on the entire structure, preferably to a thickness of about 400 nm, and a re-flow process, is performed at about 850° C.

Figure 2D:
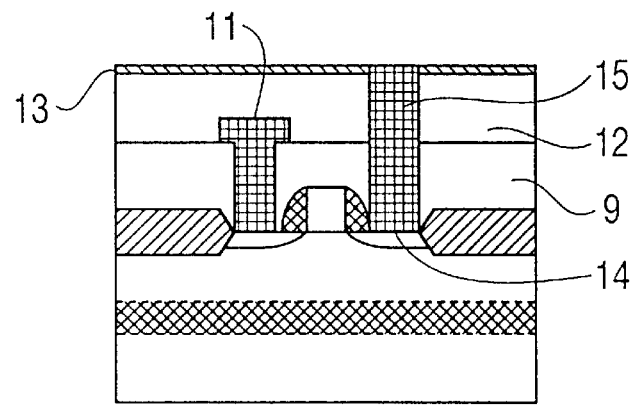

As shown in FIG. 2D, a silicon-nitride layer 13, serving as an etching stopper is formed on the entire surface. Then, a contact hole 14 is made through the interlayer insulator layer 12 and the silicon-nitride layer 13 to one of the n-type impurity regions. Then, a layer of doped polysilicon having a preferred thickness of 400 nm is formed over the silicon nitride layer 13 to form a plug 15, filled into the contact hole 14 and is then removed by an anisotropic etching.

Figure 2E:
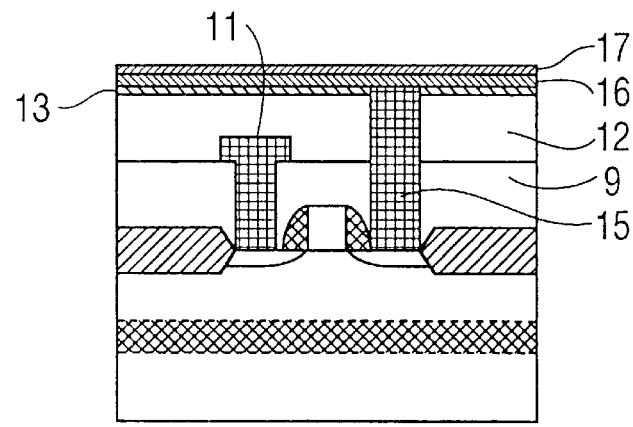

As shown in FIG. 2E, a first smooth polysilicon layer 16, having a thickness of about 50 nm, is formed on the entire surface of the silicon nitride layer 13 using a chemical vapor deposition (CVD) process. Preferably this CVD process uses $SiH_4$ as a source gas, operates at a temperature of 620° C. and a pressure of 0.2 Torr, and uses heavily-doped phosphorus. A first rough polysilicon layer 17, having a thickness of about 150 nm, is then formed on the first smooth polysilicon layer 16. The first rough polysilicon layer 17 has a first rough surface, which has an increased surface area compared to a smooth surface. Phosphorus is implanted into the first rough polysilicon layer 17 at an energy level of 40 KeV and a density of $5 \times 10^{14}$ $cm^{-2}$ in order to cause it to be conductive. The temperature of the CVD process is a key point in the formation of the first rough polysilicon layer 17. When $SiH_4$ is used as a source gas, the pressure is 0.2 Torr, and the temperature is less than 555° C., amorphous silicon is formed. When $SiH_4$ is used as a source gas, the pressure is 0.2 Torr, and the temperature is more than 580° C., polysilicon is formed. The process of the present invention forms rough polysilicon at a temperature between 555° C. and 580° C. In the present invention, an effective area of the first rough polysilicon layer 17 formed at a temperature of 570° C. is twice as great as that of a conventional polysilicon layer of equal size.

Figure 2F:
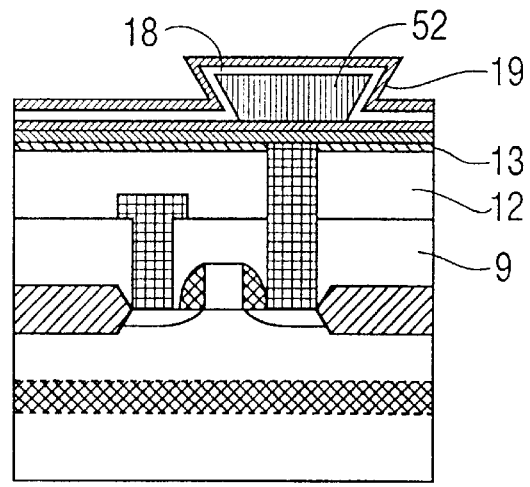

As shown in FIG. 2F, a silicon oxide film 52, at thickness 500 nm is formed on the rough polysilicon 17 with a CVD process, and then the silicon oxide layer 52 is patterned as the rough polysilicon 17 being located in the predetermined portion for forming a storage electrode remains. Here, the patterned silicon oxide layer 52 is undercut at a sidewall thereof, therefore the patterned silicon oxide layer 52 has a shape of the reverse taper. The patterned silicon oxide layer 52 serves as a spacer. Then, a polysilicon 18, a thickness 30 nm is formed on the entire surface with a CVD process and heavily doped phosphorus. A surface of the polysilicon 18 is flat and smooth. Here, a condition of CVD is a source gas, $SiH_4$, a temperature, 620° C. and a pressure, 0.2 Torr. Then, a rough polysilicon 19, a thickness 150 nm has a rough surface, which is formed on the polysilicon 18. Here, a condition of CVD is a source gas, $SiH_4$, a temperature, 620° C. and a pressure, 0.2 Torr. Then, phosphorus is implanted to the rough polysilicon 19 with a condition of 40 keV and $5 \times 10^{15}$ $cm^{-2}$, in order to have a conductivity.

Figure 2G:
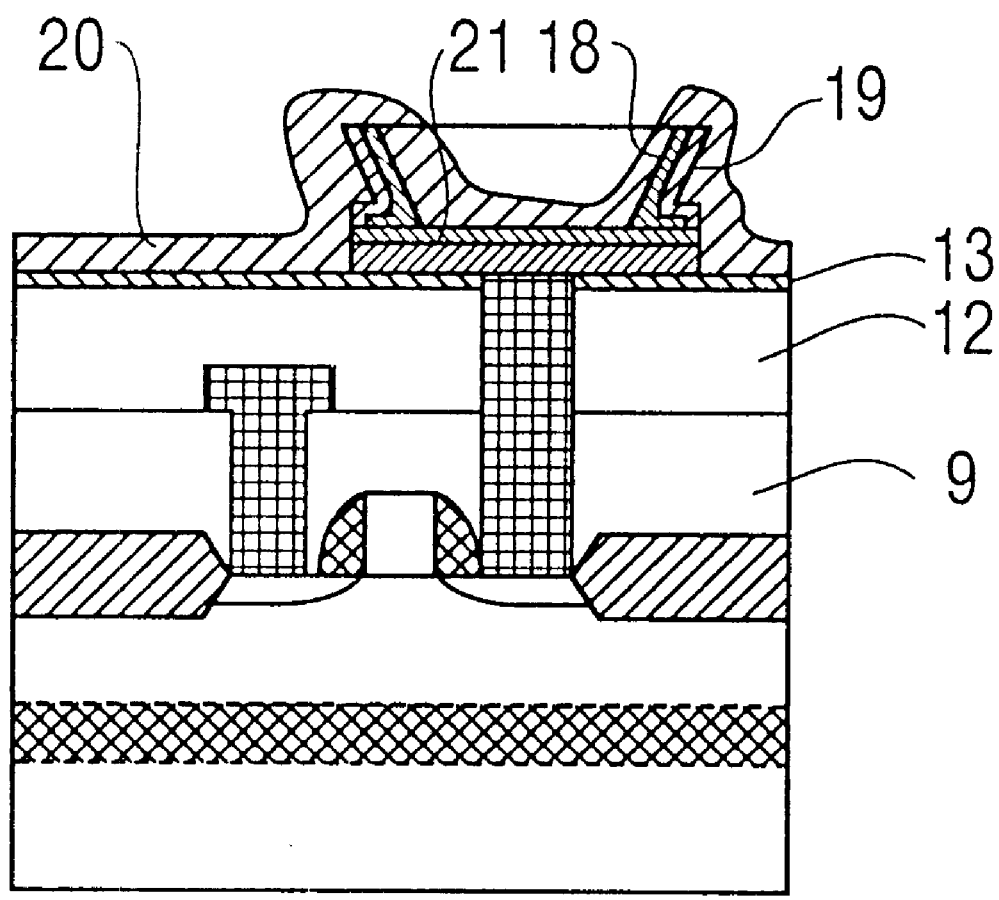

As shown in FIG. 2G, a rough-surfaced sidewall made from the second smooth polysilicon layer 18 and the second rough polysilicon layer 19 is formed along a sidewall of the spacer 52 by heavily anisotropically etching the second smooth polysilicon layer 18 and the second rough polysilicon layer 19. Together the first smooth and rough polysilicon layers 16 and 17 are etched. The spacer 52 is then removed, preferably by dilute hydrofluoric acid. Here, the silicon-nitride layer 13 serves as an etching stopper layer. Here, since the rough polysilicon 19 accumulates in the undercut portion of the spacer 52, the rough polysilicon 19 formed on a sidewall of the spacer 52 can be prevented from being over-etched when the rough polysilicon 19 is anisotropically etched.

The second smooth and rough polysilicon layers 18 and 19, form a lower electrode. A dielectric layer 21, made, e.g., of silicon-nitride, is then formed over the resulting structure. The dielectric layer 21 is then annealed in a wet atmosphere to decrease its leakage current and defect density. A third polysilicon layer 20, preferably having a thickness of 100 nm and being heavily implanted with phosphorus, is then formed over the dielectric layer 21. The third polysilicon layer 20 serves as a plate electrode. Together the first smooth and rough polysilicon layers 16 and 17, and the second smooth and rough polysilicon layers 18 and 19, forming a storage electrode, along with the dielectric layer 21 and the third polysilicon layer 20, forming a plate electrode, comprise a storage capacitor.

Since the capacitor of the semiconductor memory of the second embodiment formed as described above has the storage electrode comprising a shape of the cylindrical structure having rough polysilicon portions on base and sidewall portions thereof, it can increase electrostatic capacitance.

Further, since the rough portions of the base and sidewall rough storage electrode layers are respectively formed by independently controlling a condition of Chemical Vapor Deposition, it can easily control formations of the rugged portions of the capacitor, therefore it can achieve the improvement of the productivity of the rough portions.

Further, since the second embodiment accumulates through polysilicon in the undercut portion of the spacer, the rough polysilicon formed on a sidewall of the spacer can be prevented from being over-etched when the anisotropic etching process is performed. Accordingly, the second embodiment can achieve a stability of a memory operation.

FIGS. 3A–3G are cross-sectional views showing the steps of forming a semiconductor memory device according to a third preferred embodiment of the present invention.

Figure 3A:
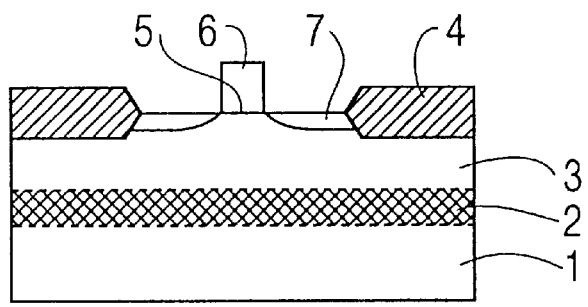
FIGS. 3A–3G are cross-sectional views showing the steps of forming a semiconductor memory device according to a third preferred embodiment of the present invention.

As shown in FIG. 3A, a p-type substrate 1 is provided. The p-type substrate 1 preferably has a resistivity of about 10 Ω. A field oxide layer 4 is then formed in the p-type substrate 1 using LOCOS (Local Oxidation of Silicon). Then, a buried n-type guard layer 2 is formed by implanting phosphorus (P) into the p-type substrate 1, under an implantation having a condition of 800 keV, $1 \times 10^{13}$ $cm^{-2}$. Then, a p-type well 3 is formed by implanting boron (B) into the p-type substrate 1, under an implantation having a condition of 500 keV, 100 keV, and 30 keV, each $5 \times 10^{13}$ $cm^{-2}$. Then, a gate oxide film 5, a thickness of about 6 nm is formed on the p-type substrate 1 using a thermal oxidation. A gate electrode 6 is then formed on the gate oxide film 5. Then, a pair of n-type impurity regions 7 having a low density are formed by implanting n-type impurities in the p-type substrate 1 with the gate electrode 6 and the field oxide layer 4 as a mask.

Figure 3B:
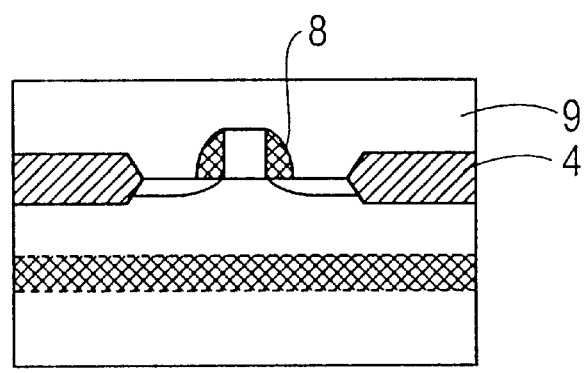

As shown in FIG. 3B, a sidewall 8 is formed on an edge portion of the gate electrode 6. Then, a BPSG film serving as an interlayer insulator layer 9 is formed on the entire structure, preferably to a thickness of about 400 nm, and a re-flow process, 850° C.

Figure 3C:
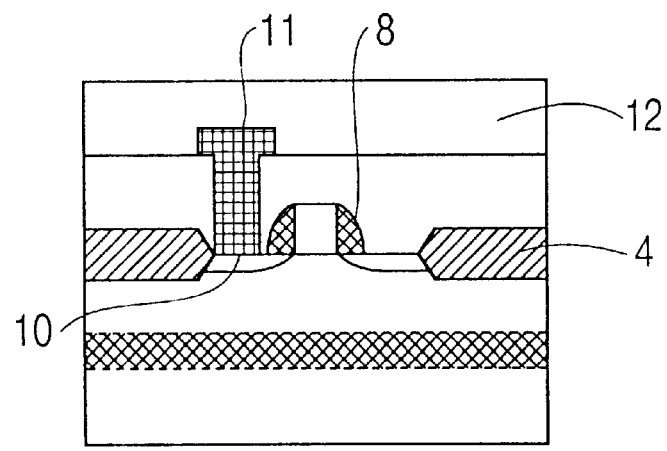

As shown in FIG. 3C, a contact hole 10 is formed going through the interlayer insulator layer 9 and then tungsten-silicide, a thickness 120 nm/doped-polysilicon layer, a thickness 50 nm are buried into the contact hole 10 with an anisotropic etching. Here, the tungsten-silicide serves as a bit line 11. Then, a BPSG film serving as a interlayer insulator layer 12, is formed on the entire structure, preferably to a thickness of about 400 nm, and a re-flow process, is performed at about 850° C.

Figure 3D:
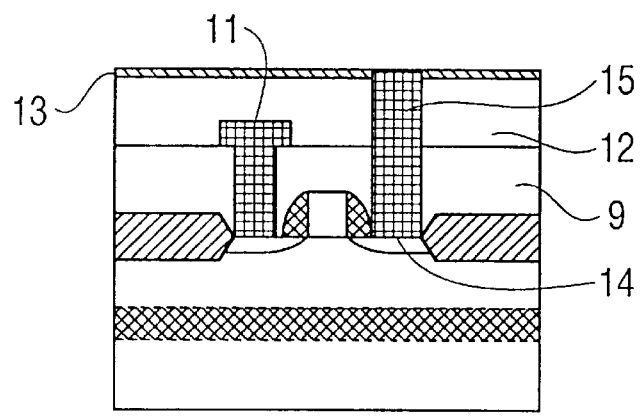

As shown in FIG. 3D, a silicon-nitride layer 13, serving as an etching stopper is formed on the entire surface. Then, a contact hole 14 is made through the interlayer insulator layer 12 and the silicon-nitride layer 13 to one of the n-type impurity regions. Then, a layer of doped polysilicon having a preferred thickness of 400 nm is formed over the silicon nitride layer 13 to form a plug 15, filled into the contact hole 14 and is then removed by an anisotropic etching.

Figure 3E:
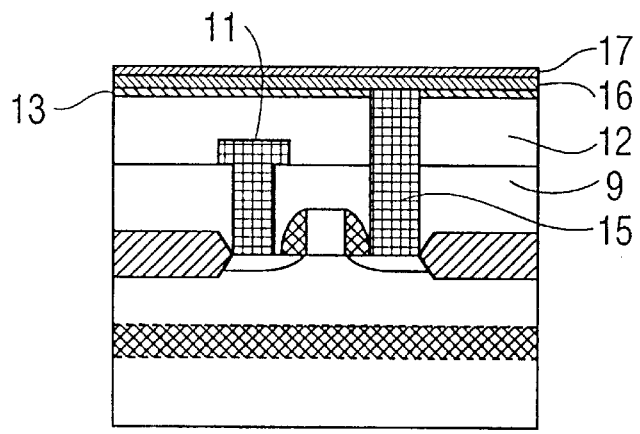

As shown in FIG. 3E, a first smooth polysilicon layer 16, having a thickness of about 50 nm, is formed on the entire surface of the silicon nitride layer 13 using a chemical vapor deposition (CVD) process. Preferably this CVD process uses $SiH_4$ as a source gas, operates at a temperature of 620° C. and a pressure of 0.2 Torr, and uses heavily-doped phosphorus. A first rough polysilicon layer 17, having a thickness of about 150 nm, is then formed on the first smooth polysilicon layer 16. The first rough polysilicon layer 17 has a first rough surface, which has an increased surface area compared to a smooth surface. Phosphorus is implanted into the first rough polysilicon layer 17 at an energy level of 40 KeV and a density of $5 \times 10^{15}$ $cm^{-2}$ in order to cause it to be conductive.

The temperature of the CVD process is a key point in the formation of the first rough polysilicon layer 17. When $SiH_4$ is used as a source gas, the pressure is 0.2 Torr, and the temperature is less than 555° C., amorphous silicon is formed. When $SiH_4$ is used as a source gas, the pressure is 0.2 Torr, and the temperature is more than 580° C., polysilicon is formed. The process of the present invention forms rough polysilicon at a temperature between 555° C. and 580° C. In the present invention, an effective area of the first rough polysilicon layer 17 formed at a temperature of 570° C. is twice as great as that of a conventional polysilicon layer of equal size.

Figure 3F:
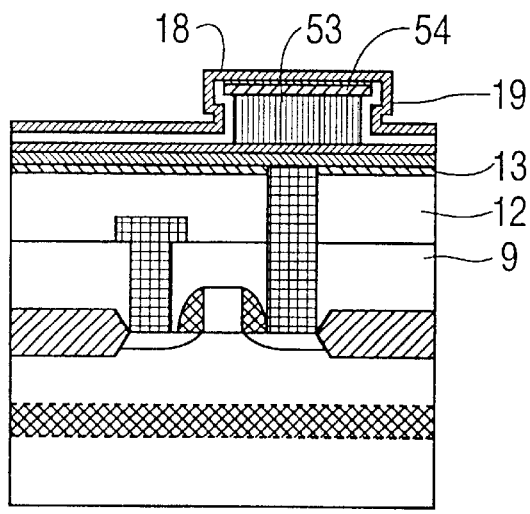

As shown in FIG. 3F, a silicon oxide film (for example, PSG) 53, a thickness 450 nm is formed on the rough polysilicon 17 with a CVD process. Then a silicon oxide film 54, a thickness 450 nm, that doesn't include impurities, is formed on the silicon oxide film 53. Then the silicon oxide layers 53, 54 are patterned on the rough polysilicon 17, being located in the predetermined portion for forming a storage electrode. Here, since the silicon oxide film 54 has smaller etching rate than the silicon oxide film 53, a sidewall of the silicon oxide film 54 protrudes from that of the silicon oxide film 53. Therefore, the patterned silicon oxide layer 53 has an under-cut sidewall with respect to the silicon oxide film 54. The patterned silicon oxide layers 53, 54 serve as a spacer. Then, a polysilicon 18, a thickness 30 nm is formed on the entire surface with a CVD process and heavily doped phosphorus. A surface of the polysilicon 18 is flat and smooth. Here, a condition of CVD is a source gas, $SiH_4$, a temperature, 620° C. and a pressure, 0.2 Torr. Then, a rough polysilicon 19, a thickness 140 nm has a rough surface, is formed on the polysilicon 18. Here, a condition of CVD is a source gas, $SiH_4$, a temperature, 620° C. and a pressure, 0.2 Torr. Then, phosphorus is implanted to the rough polysilicon 19 with a condition of 40 keV and $5 \times 10^{15}$ $cm^{-2}$, in order to have a conductivity.

Figure 3G:
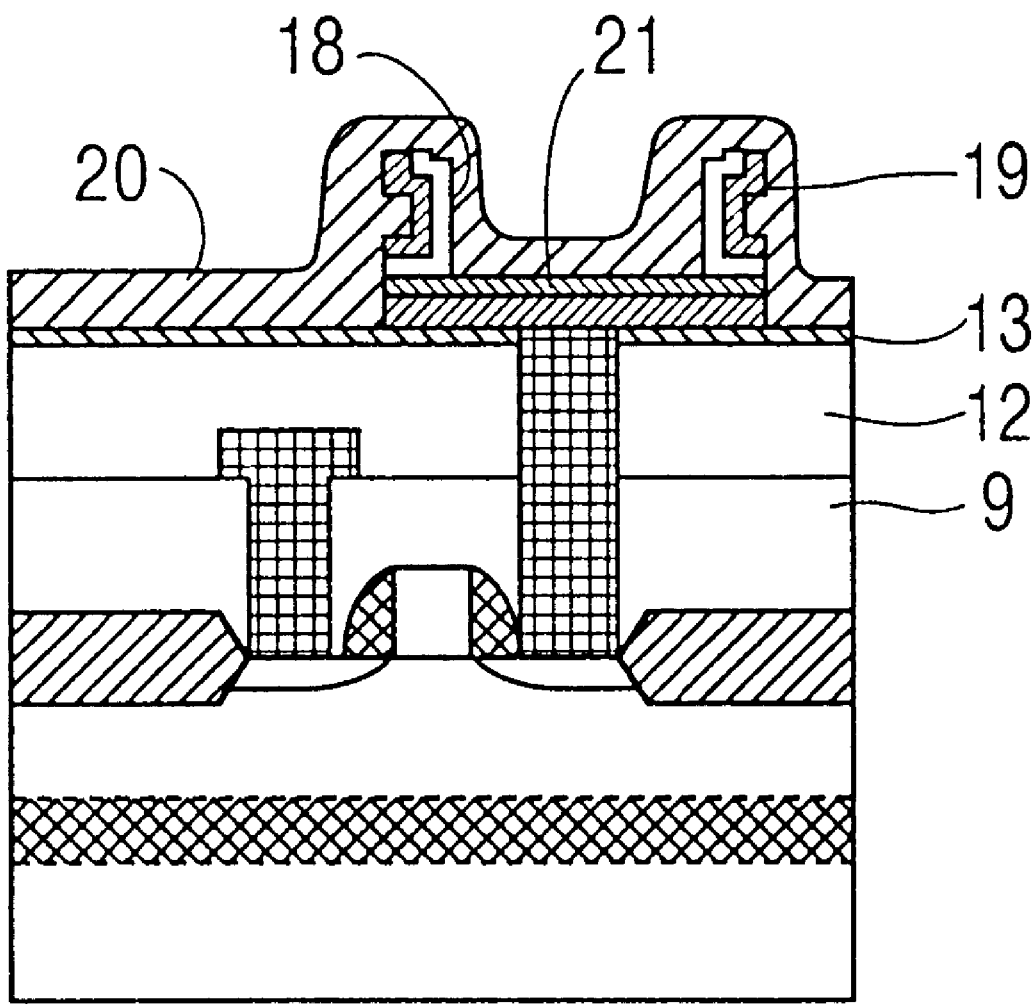
Figure 4:
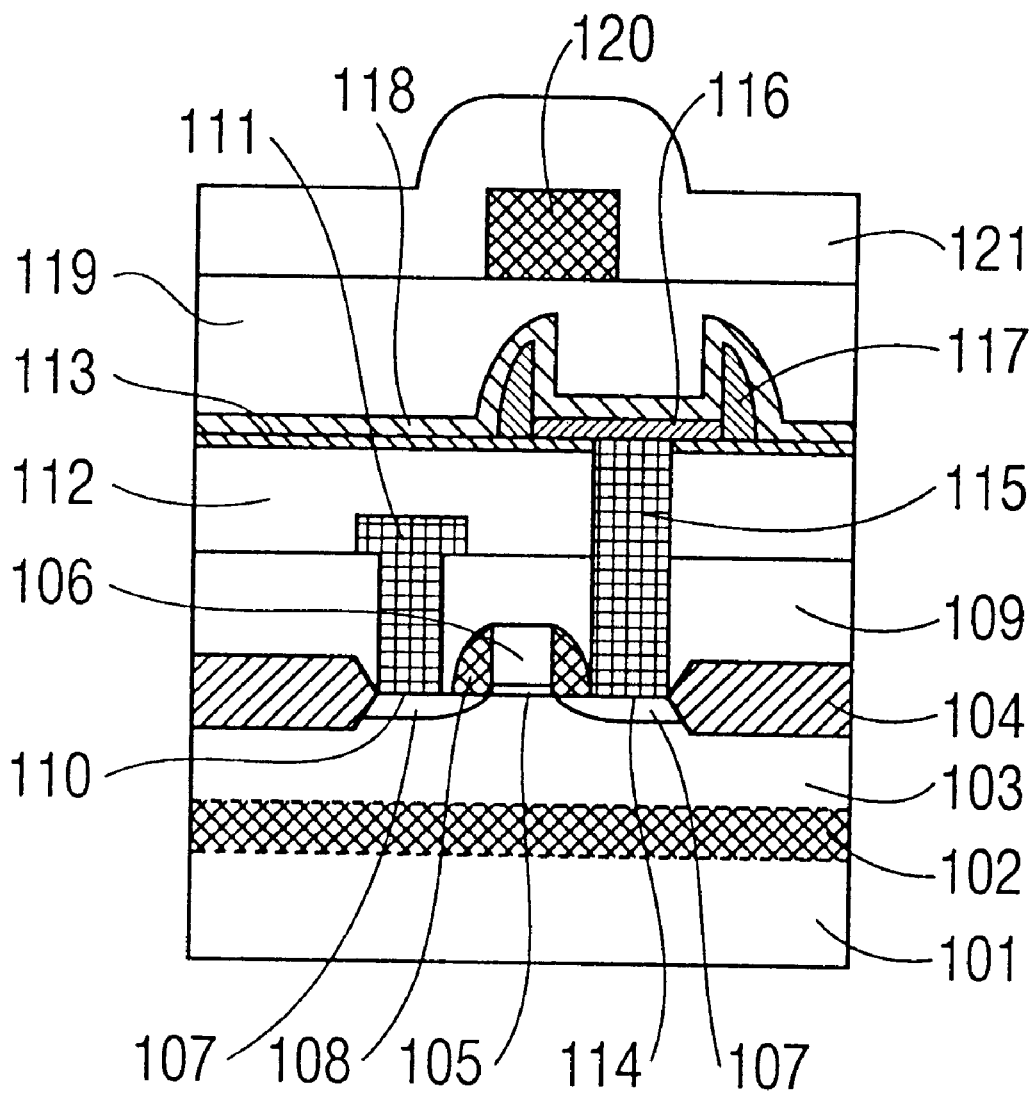
FIG. 4 is a cross sectional view showing steps of forming a conventional semiconductor memory device.

As shown in FIG. 3G, a sidewall consisted of the polysilicon 18 and the rough polysilicon 19 is formed on a sidewall of the spacers 53, 54 by heavily anisotropic etching the polysilicon 18 and the rough polysilicon 19. Together the first smooth and rough polysilicon layers 16 and 17 are etched. The spacers 53, 54 are then removed with dilute hydrofluoric acid. Here, since the rough polysilicon 19 accumulates in the undercut portion of the spacers 53, 54, the rough polysilicon 19 formed on a sidewall of the spacers 53, 54 can be prevented from being over-etched when the rough polysilicon 19 anisotropically etched. Then, a dielectric film, for example silicon-nitride (not shown) is formed on the entire surface, and then the dielectric film is subjected to an anneal process in an atmosphere wet in order to decrease a leak current and a defect density of the dielectric film. Then, a polysilicon 20, a thickness 100 nm, heavily implanted phosphorus is formed on the dielectric film. The polysilicon 20 serves as a plate electrode.

Since the capacitor of the semiconductor memory of the third embodiment formed as described above has the storage electrode comprising a shape of the cylindrical structure having rough polysilicon portions on base and sidewall portions thereof, it can increase electrostatic capacitance.

Further, since the rough portions of the base and sidewall rough storage electrode layers are respectively formed by independently controlling a condition of Chemical Vapor Deposition, it can easily control formations of the rugged portions of the capacitor, therefore it can achieve the improvement of the productivity of the rough portions.

Further, since the third embodiment accumulates the rough polysilicon in the undercut portion of the spacers comprising two layers, the rough polysilicon formed on a sidewall of the spacers can be prevented from being over-etched when the anisotropic etching process is performed.

Accordingly, the third embodiment can achieve a stability of a memory operation.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of forming a semiconductor memory device comprising:

forming a first lower electrode layer over a semiconductor substrate, the first lower electrode layer having a first smooth polysilicon layer over the semiconductor substrate and a first rough polysilicon layer on the first smooth polysilicon layer;

forming a second lower electrode layer on the first lower electrode layer, the second lower electrode layer having a second smooth polysilicon layer on the first lower electrode layer and a second rough polysilicon layer on the second smooth polysilicon layer;

forming a dielectric layer on the first and second lower electrode layers; and forming an upper electrode layer on the dielectric layer, the first and second smooth polysilicon layers and the first and second rough polysilicon layers being selectively formed by chemical vapor deposition processes, the first and second smooth polysilicon layers being formed at a temperature more than 580° C. and the first and second rough polysilicon layers being formed at a temperature between 555° C. and 580° C.

2. The method forming a semiconductor memory device as recited in claim 1, further comprising forming a switching transistor over the semiconductor substrate, the first lower electrode layer being electrically connected to the switching transistor.

3. The method of forming a semiconductor device as recited in claim 2, wherein the switching transistor comprises a gate electrode and a pair of impurity regions.

4. The method of forming a semiconductor memory device as recited in claim 1, wherein the first and second lower electrode layers are storage electrodes.

5. The method of forming a semiconductor memory device as recited in claim 1, wherein the first and second lower electrode layers have a cylindrical structure.

6. The method of forming a semiconductor memory device as recited in claim 1, wherein the first and second lower electrode layers, the dielectric layer, and the upper electrode layer form a capacitor.

7. The method of forming a semiconductor memory device as recited in claim 6, wherein the capacitor is cylindrical.

8. The method of forming a semiconductor memory device as recited in claim 1, wherein the second rough polysilicon layer is formed on a sidewall of the second lower electrode layer.

9. A method of forming a semiconductor memory device compromising:
    forming a first lower electrode layer over a semiconductor substrate, the first lower electrode layer having a first smooth polysilicon layer over the semiconductor substrate and a first rough polysilicon layer on the first smooth polysilicon layer;
    forming a mask layer over the first lower electrode layer, the mask layer having a different etching rate than the first lower electrode layer;
    patterning the mask layer;
    forming a second lower electrode layer over the first lower electrode layer and the patterned mask layer, the second lower electrode layer having a second smooth polysilicon layer on the first lower electrode layer and the patterned mask layer and having a second rough polysilicon layer on the second smooth polysilicon layer;
    selectively removing the patterned mask layer and a portion of the second lower electrode located over the patterned mask layer;
    forming a dielectric layer over the first and second lower electrode layers; and
    forming an upper electrode layer over the dielectric layer,
    the first and second smooth polysilicon layers and the first and second rough polysilicon layers being selectively formed by chemical vapor deposition processes, the first and second smooth polysilicon layers being formed at a temperature more than 580° C. and the first and second rough polysilicon layers being formed at a temperature between 555° C. and 580° C.

10. The method of forming a semiconductor memory device as recited in claim 9, further comprising forming a switching transistor over the semiconductor substrate, the first lower electrode layer being electrically connected to the switching transistor.

11. The method of forming a semiconductor memory device as recited in claim 10, wherein the switching transistor comprises a gate electrode and a pair of impurity regions.

12. The method of forming a semiconductor memory device as recited in claim 9, wherein the first and second lower electrode layers are storage electrodes.

13. The method of forming a semiconductor memory device as recited in claim 9, wherein the first and second lower electrode layers have a cylindrical structure.

14. The method of forming a semiconductor memory device as recited in claim 9, wherein the first and second lower electrode layers, the dielectric layer, and the upper electrode layer form a capacitor.

15. The method of forming a semiconductor memory device as recited in claim 14, wherein the capacitor is cylindrical.

16. The method of forming a semiconductor memory device as recited in claim 9, wherein the second rough polysilicon layer is formed on a sidewall of the second lower electrode layer.

17. The method of forming a semiconductor memory device as recited in claim 9, wherein the mask layer is formed in a shape of a reverse taper.

18. A method of forming a semiconductor memory device comprising:
    forming a first lower electrode layer over a semiconductor substrate, the first lower electrode layer having a first smooth polysilicon layer over the semiconductor substrate and a first rough polysilicon layer on the first smooth polysilicon layer;
    forming a first mask layer over the first lower electrode layer, the first mask layer having a different etching rate than the first mask layer;
    forming a second mask layer over the first mask layer, the second mask layer having a smaller etching rate than the first mask layer;
    patterning the first and second mask layers such that a sidewall of the patterned second mask layer protrudes further than a sidewall of the patterned first mask layer;
    forming a second lower electrode layer over the first lower electrode layer and the patterned first and second mask layers, the second lower electrode layer having a second smooth polysilicon layer on the first lower electrode layer and the patterned first and second mask layers and having a second rough polysilicon layer on the second smooth polysilicon layer;
    selectively removing the patterned first and second mask layers and a portion of the second lower electrode located over the patterned first and second mask layers;
    forming a dielectric layer over the first and second lower electrode layers; and
    forming an upper electrode layer over the dielectric layer,
    the first and second smooth polysilicon layers and the first and second rough polysilicon layers being selectively formed by chemical vapor deposition processes, the first and second smooth polysilicon layers being formed at a temperature more than 580° C. and the first and second rough polysilicon layers being formed at a temperature between 555° C. and 580° C.

19. The method of forming a semiconductor memory device as recited in claim 18, further comprising forming a switching transistor over the semiconductor substrate, the first lower electrode layer being electrically connected to the switching transistor.

20. The method of forming a semiconductor memory device as recited in claim 19, wherein the switching transistor comprises a gate electrode and a pair of impurity regions.

21. The method of forming a semiconductor memory device as recited in claim 18, wherein the first and second lower electrode layers are storage electrodes.

22. The method of forming a semiconductor memory device as recited in claim 18, wherein the first and second lower electrode layers have a cylindrical structure.

23. The method of forming a semiconductor memory device as recited in claim 18, wherein the first and second lower electrode layers, the dielectric layer, and the upper electrode layer form a capacitor.

24. The method of forming a semiconductor memory device as recited in claim 23, wherein the capacitor is cylindrical.

25. The method of forming a semiconductor memory device as recited in claim 18, wherein the second rough polysilicon layer is formed on a sidewall of the second lower electrode layer.

26. A method of forming a semiconductor memory device comprising:

forming a first lower electrode layer over a semiconductor substrate, the first lower electrode layer having a first smooth polysilicon layer over the semiconductor substrate and a first rough polysilicon layer on the first smooth polysilicon layer;

forming a second lower electrode layer on the first lower electrode layer, the second lower electrode layer having a second smooth polysilicon layer on the first lower electrode layer and a second rough polysilicon layer on the second smooth polysilicon layer, forming a dielectric layer on the first and second lower electrode layers; and forming an upper electrode layer on the dielectric layer.

\* \* \* \* \*